United States Patent [19]

Phillips

[11] Patent Number: 4,646,015
[45] Date of Patent: Feb. 24, 1987

[54] FLUX GATE SENSOR WITH IMPROVED SENSE WINDING GATING

[75] Inventor: Alan C. Phillips, Los Altos, Calif.
[73] Assignee: Etak, Inc., Menlo Park, Calif.
[21] Appl. No.: 675,827
[22] Filed: Nov. 28, 1984
[51] Int. Cl.$^4$ ............................................. G01R 33/04
[52] U.S. Cl. ...................................... 324/253; 33/361
[58] Field of Search ......................... 324/233, 253–255, 324/117 R; 33/361; 318/647; 340/870.33

[56] References Cited

U.S. PATENT DOCUMENTS

| 3,337,796 | 8/1967 | Hentschel et al. | 324/233 |
| 3,541,432 | 11/1970 | Scarbrough | 324/255 |
| 3,775,674 | 11/1973 | Van Sloun et al. | 324/253 |
| 4,059,796 | 11/1977 | Rhodes | 324/253 |
| 4,277,751 | 7/1981 | Lawson et al. | 324/254 |
| 4,497,034 | 1/1985 | Kuno et al. | 324/253 X |

Primary Examiner—Gerard R. Strecker
Attorney, Agent, or Firm—Fliesler, Dubb, Meyer & Lovejoy

[57] ABSTRACT

A flux gate sensor having sense windings for providing an output proportional to the strength of an external magnetic field in which the sensor is placed. A gating circuit which is responsive to a pulse which is generated when the core of the sensor is driven into and out of saturation gates the output of the sense windings to a pair of filters which in turn provide an output proportional to the intensity of the external magnetic field. With two sense windings the outputs of the filters may be used to determine the direction of the magnetic field relative to the sensor and thereby be used as a compass.

10 Claims, 3 Drawing Figures

FLUX GATE SENSOR WITH IMPROVED SENSE WINDING GATING

BACKGROUND OF THE INVENTION

1. Field of the Invention

The present invention relates to a flux gate sensor in general and to a flux gate sensor for use in a flux gate compass in particular.

2. Description of Prior Art

A flux gate sensor is a device used for measuring the intensity of an external magnetic field in which the sensor is placed. In general, it comprises a saturable core, a drive winding for driving the core into and out of saturation and one or more sense windings. The sense windings provide, when properly orientated relative to the external magnetic field, a signal proportional to the strength of the external magnetic field.

In operation, when the core of the flux gate sensor is saturated, lines of flux due to the external magnetic field pass uniformly through the core. That is to say, the permeability or the reluctance of the core is such that the lines of flux due to the external magnetic field do not concentrate in the core. On the other hand, when the core is not saturated, the permeability of the core is such that the core presents a path of least reluctance to the lines of flux of the external magnetic field resulting in a concentration of those lines in the core which alters the magnitude of the flux concentrated in the core.

In practice, the above-described change in the concentration of the lines of flux due to the external magnetic field in the core is detected by the sense winding. When an external magnetic field is the earth's magnetic field and the flux gate sensor is provided with two or more orthogonally orientated sense windings, the outputs of the sense windings will provide signals which are dependent on the orientation of the earth's magnetic field relative to the sensor, i.e., sense windings. Of course, a sensor with only one sense winding will provide an output which is dependent on the relative orientation of the sense winding and a magnetic field in which it is placed. However, by using multiple sense windings, information indicative of this orientation can be obtained without moving the sensor. Thus, when constructed with multiple orthogonally orientated sense windings, a flux gate sensor may be used as a compass.

Flux gate sensors of various configurations have been made. In a prior known flux gate sensor, such as disclosed in U.S. Pat. No. 4,277,751, there was provided a saturable core, e.g. toroid, a drive winding for driving the core into and out of saturation and at least two sense windings. The sense windings were wound about opposite legs of the core.

In the operation of the prior known sensor, it is known that when the core is not saturated, the lines of flux from an external magnetic field will increase the flux concentration in that leg of the core, e.g. toroid, in which the lines of flux from the external field are in the same direction as the lines of flux generated in the core by the drive winding. Conversely, the flux concentration will be decreased in that leg of the core in which the direction of the lines of flux from the external magnetic field is opposite to the direction of the lines of flux generated in the core by the drive winding. Under these conditions, as the core is driven into and out of saturation, the time that each of the legs goes into and out of saturation will be different by a period proportional to the strength of the external magnetic field. Since each of the sense windings provide an output as their respective leg goes into and out of saturation, a measure of this period can be obtained from the sense windings to provide a signal proportional to the strength of the external magnetic field.

In another prior known flux gate sensor, such as disclosed in U.S. Pat. No. 3,541,432, there was provided a saturable core, a drive winding for driving the core into and out of saturation, a sense winding, an apparatus including a filter for providing an output from the sense winding comprising the second harmonic of the drive winding oscillator frequency and an apparatus for synchronously demodulating the second harmonic to provide a D.C. output having a magnitude proportional to the strength of an external magnetic field in which the sensor was located.

A principal disadvantage of the latter sensor is that in order to provide a reliable output from the sense winding, it is necessary to keep the core in saturation for a significant portion of the period of the oscillator, e.g. 20-50% of the pulse period of the oscillator, or the magnitude of the second harmonic from the filter coupled to the sense winding is always close to zero volts. Of course, keeping the core in saturation for the required period consumes an undesirable amount of power or requires the use of relatively expensive cores.

Another disadvantage of the latter prior known sensor is the requirement for a filter to provide the second harmonic from the output of the sense winding. Such filters are typically expensive and require adjustments to keep them operating at the desired frequency.

SUMMARY OF THE INVENTION

In view of the foregoing, a principal object of the present invention is a flux gate sensor for measuring the strength of a magnetic field comprising a sense winding and a saturable core which is required to be saturated for only a fraction of the time required in prior known flux gate sensor apparatus.

Another object of the present invention is a flux gate sensor as described above comprising a drive winding and an oscillator for driving the core into and out of saturation wherein the period of core saturation is less than 1% of the pulse period of the oscillator.

In accordance with the above objects there is provided a flux gate sensor comprising a saturable core, a drive winding, an oscillator circuit coupled to the drive winding for driving the core into and out of saturation, a sense winding, a filtering circuit having an output and a gating circuit responsive to a pulse which is generated in the oscillator circuit when the core is driven into and out of saturation for gating an output from the sense winding to the filtering circuit.

In the above-described sensor, with a proper orientation of the sense winding relative to an external magnetic field, the output of the filtering circuit is proportional to the strength of the external magnetic field. If two or more orthogonally orientated sense windings are employed in the sensor, the outputs of the filters coupled thereto may be used for providing a signal proportional to the direction of the external magnetic field relative to the sensor without moving the sensor. In the latter case, if the magnetic field is the earth's magnetic field, the sensor may be used as a compass. The sensor therefore measures the relative bearing of the earth's magnetic field, and the strength of the earth's magnetic field. The measurement of the strength of the earth's field can be useful for compass calibration.

In contrast to prior known flux gate sensors comprising a saturable core and one or more sense windings, the sensor of the present invention has the advantage that the core is saturated for only a fraction of the time required in prior known related apparatus and therefore has much lower power requirements than did the prior known apparatus. With much lower power requirements, it is practical to use conventional cores, e.g. ferrite cores, which typically require more power to saturate than do other available, but more expensive, cores. Furthermore, the apparatus of the present invention has the advantage that it can use relatively inexpensive circuit components including a filter without any appreciative loss in performance and without any need for periodic adjustments to maintain performance.

BRIEF DESCRIPTION OF THE DRAWING

The above and other objects, features and advantages of the present invention will become apparent from the following detailed description of the accompanying drawing in which.

DETAILED DESCRIPTION OF THE DRAWING

Figure 1:
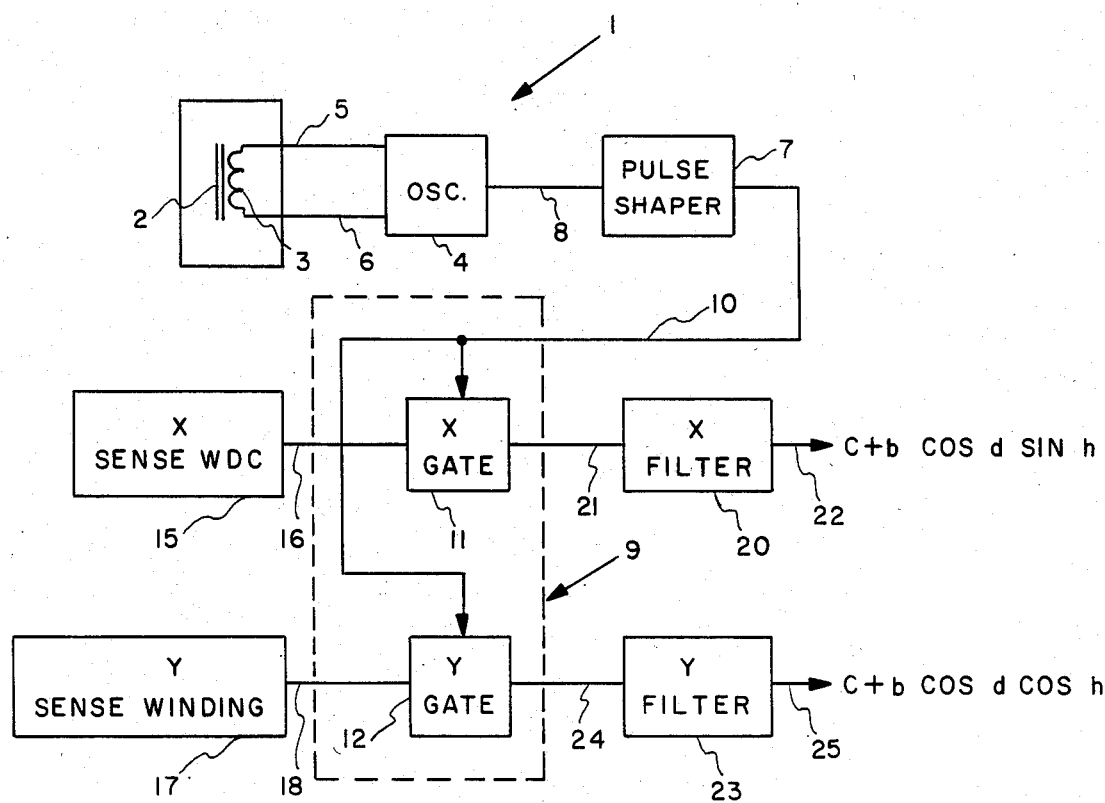
FIG. 1 is a block diagram of a flux gate compass in accordance with the present invention.

Referring to FIG. 1, there is provided in accordance with the present invention a flux gate sensor apparatus designated generally as 1. In the apparatus 1 there is provided a saturable magnetic core 2 which is represented by two parallel lines, and a drive winding 3. The top and bottom of the drive winding 3 are coupled to the output of an oscillator 4 by means of a pair of lines 5 and 6, respectively. The oscillator 4 is also coupled to a pulse shaper 7 by means of a line 8. The output of the pulse shaper 7 is coupled to a gate circuit 9 by means of a line 10.

In the gate circuit 9 there is provided an X gate 11 and a Y gate 12. The input of the X gate 11 is coupled to an X sense winding 15 by means of a line 16. The input to the Y gate 12 is coupled to a Y sense winding 17 by means of a line 18. The output of the X gate 11 is coupled to the input of an X filter 20 by means of a line 21. The output of the X filter 20 is provided on an output line 22. The output of the Y gate 12 is coupled to a Y filter 23 by means of a line 24. The output of the Y filter 23 is provided on an output line 25.

Figure 2A:
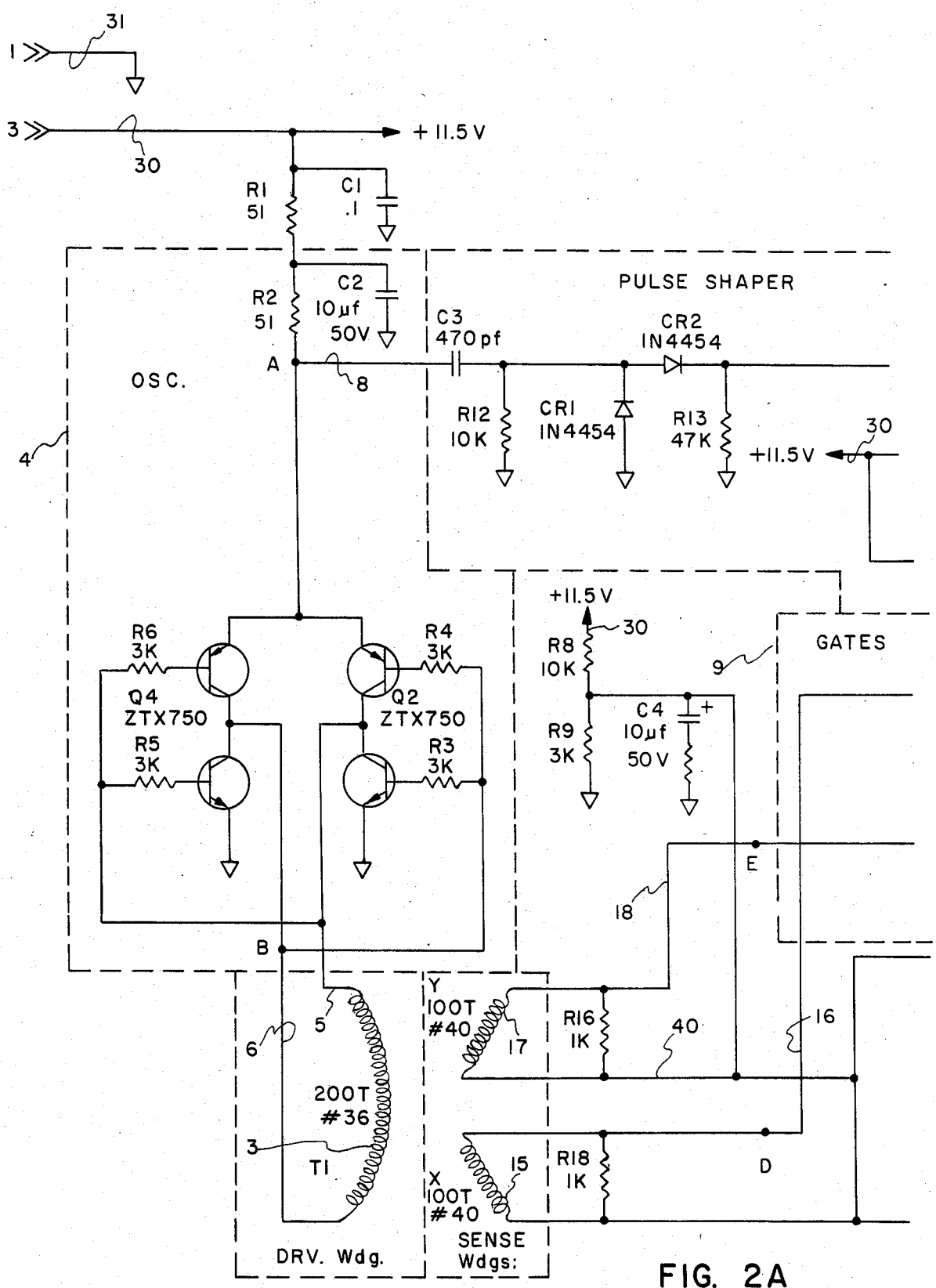
FIGS. 2A and 2B are a schematic diagram of the compass of FIG. 1.
Figure 2B:
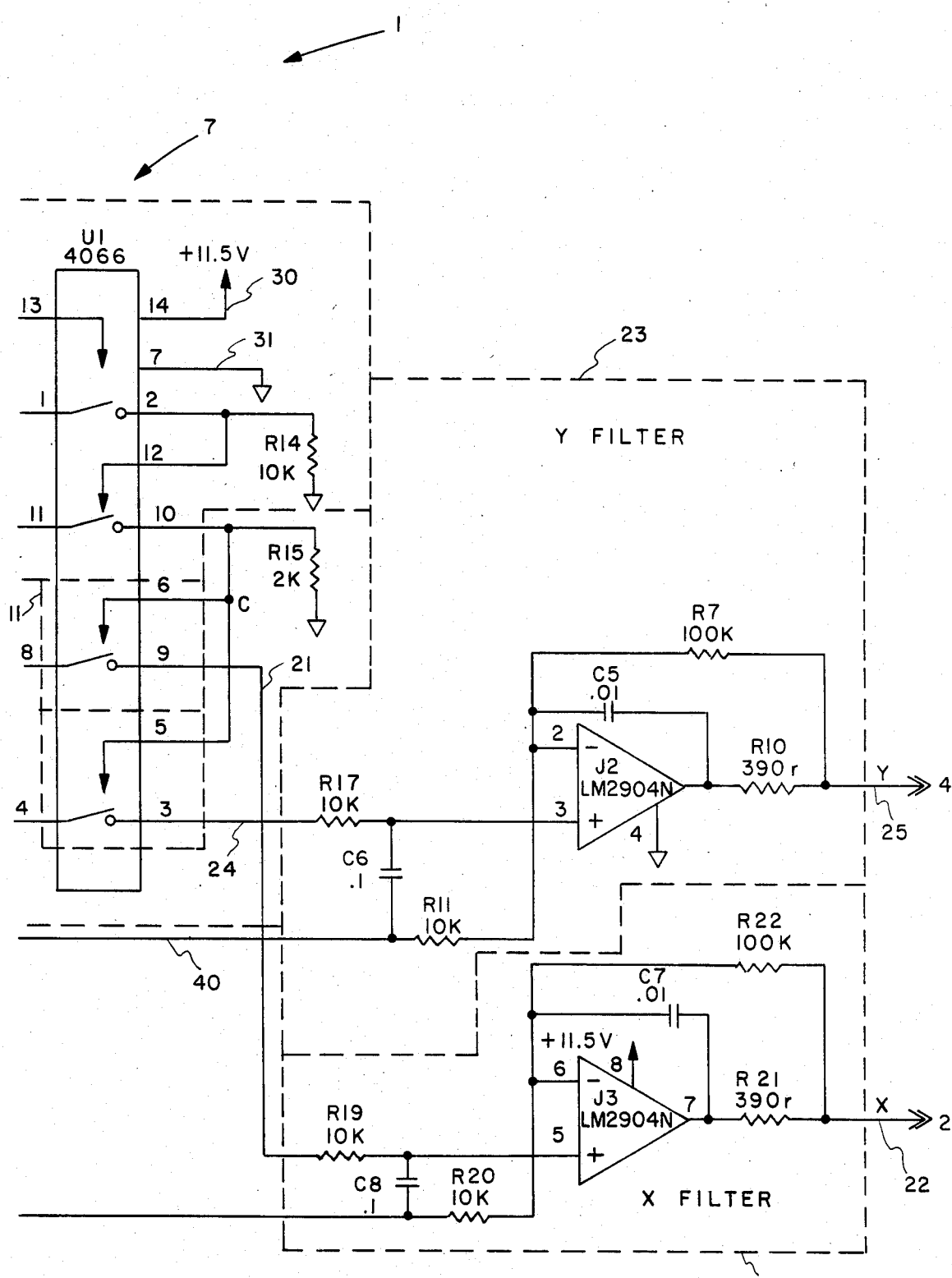

Referring to FIGS. 2A and 2B, in addition to the above-described features of the apparatus 1, there is provided in the apparatus 1 a line 30 for coupling the apparatus 1 to a source of positive potential, e.g. 11.5 volts, and a line 31 for coupling the apparatus 1 to a source of reference potential, e.g. ground. The line 30 is coupled to one end of a resistor R1 and one end of a capacitor C1. The opposite end of the resistor R1 is coupled to a resistor R2. The opposite end of the capacitor C1 is coupled to the line 31. The opposite end of the resistor R2 is coupled to the emitters of a pair of transistors Q2 and Q4 and to one end of a capacitor C3. The opposite end of the capacitor C2 is coupled to line 31. The collectors of the transistors Q2 and Q4 are coupled to the collectors of a pair of transistors Q1 and Q3. The emitters of the transistors Q1 and Q3 are coupled to the line 31. The base of Q1 is coupled through a resistor R3 and the base of Q2 is coupled through a resistor R4 to the drive winding 3 and the collectors of Q3 and Q4 by means of the line 6. The base of the transistor Q3 is coupled through a resistor R5 and the base of the transistor Q4 is coupled through a resistor R6 to the drive winding 3 and the collectors of Q1 and Q2 by means of the line 5.

The opposite side of the capacitor C3 is coupled to one side of a resistor R12, the cathode of a diode CR1 and the anode of a diode CR2. The opposite ends of the resistor R12 and diode CR1 are coupled to ground by means of the line 31. The opposite end of the diode CR2 is coupled to ground through a resistor R13 and to pin 13 of an integrated circuit U1.

The integrated circuit U1 is represented as comprising a plurality of control electrodes coupled to pins 13, 12, 6 and 5, a plurality of switch poles coupled to pins 1, 11, 8 and 4 which are controlled by the control electrodes coupled to pins 13, 12, 6 and 5, respectively, and a plurality of switch contacts adapted to be contacted by the above-described poles coupled to pins 2, 10, 9 and 3. Pins 1, 11, and 14 are coupled to the source of positive potential by means of the line 30. Pin 7 is coupled to ground by means of the line 31. Pins 2 and 12 are coupled to ground through a resistor R14. Pins 10, 6, and 5 are coupled to ground through a resistor R15.

To the right of the oscillator 4 there is provided a resistor R8 coupled to the source of potential by means of the line 30. The opposite end of the resistor R8 is coupled to ground through a resistor R9 and a parallel capacitor C4 and to one end of each of the X and Y sense windings 15 and 17 by means of a line 40. Coupled in parallel with the X sense winding 15 there is provided a resistor R18. Coupled in parallel with the Y sense winding 17 there is provided a resistor R16.

The line 18 coupled to one end of the Y sense winding 17 is coupled to the pin 4 of the integrated circuit U1. Line 16 coupled to one end of the X sense winding 15 is coupled to pin 8 of the integrated circuit U1. The contact of U1 coupled to pin 3 is coupled by means of the line 24 to pin 3 of the non-inverting input of an operational amplifier U2 in the Y filter 23 through a resistor R17. Line 40 from the Y sense winding 17 is coupled to pin 2 of the inverting input of the operational amplifier U2 through a resistor R11. A capacitor C6 is coupled between the line 40 and the pin 3 of the non-inverting input of the operational amplifier U2. Pin 2 of the inverting input of the operational amplifier U2 is also coupled to pin 1 of its output through a capacitor C5 and through a resistor R7 to the output line 25. Pin 1 of the amplifier U2 is coupled to the output line 25 through a resistor R10. In a similar fashion, pin 9 of the integrated circuit U1 is coupled to pin 5 of the non-inverting input of an operational amplifier U3 in the X filter 20 through a resistor R19. Line 40 from the X sense winding 15 is coupled to a pin 6 of the inverting input of the operational amplifier U3 in the filter 20 through a resistor R20. A capacitor C8 is coupled between the line 40 and the pin 5 of the non-inverting input of the operational amplifier U3. The pin 6 is also coupled to the output of operational amplifier U3 through a capacitor C7 and to the output line 22 through a resistor R22. The output pin 7 of amplifier U3 is coupled to the output line 22 through a resistor R21.

In a typical embodiment, the above-described components have the following values:

| | | | |
|---|---|---|---|
| R1 | 51 ohms | C1 | .1 microfarads |
| R2 | 51 ohms | C2 | 10. microfarads |
| R3 | 3K ohms | C3 | 470. picofarads |
| R4 | 3K ohms | C4 | 10. microfarads |
| R5 | 3K ohms | C5 | .01 microfarads |
| R6 | 3K ohms | C6 | .1 microfarads |
| R7 | 100K ohms | C7 | .01 microfarads |
| R8 | 10K ohms | C8 | .1 microfarads |
| R9 | 3K ohms | Q1 | ZTX650 |
| R10 | 390 ohms | Q2 | ZTX750 |
| R11 | 10K ohms | Q3 | ZTX650 |
| R12 | 10K ohms | Q4 | ZTX750 |
| R13 | 47K ohms | CR1 | 1N4454 |
| R14 | 10K ohms | CR2 | 1N4454 |
| R15 | 2K ohms | U1 | 4066 |
| R16 | 1K ohms | U2 | LM2904N |
| R17 | 10K ohms | U3 | LM2904N |
| R18 | 10K ohms | | Sense Wdgs 100 turns, #40 |
| R19 | 10K ohms | | Drive Wdg 200 turns, #36 |
| R20 | 10K ohms | | |
| R21 | 390 ohms | | |
| R22 | 100K ohms | | |

Figure 3:
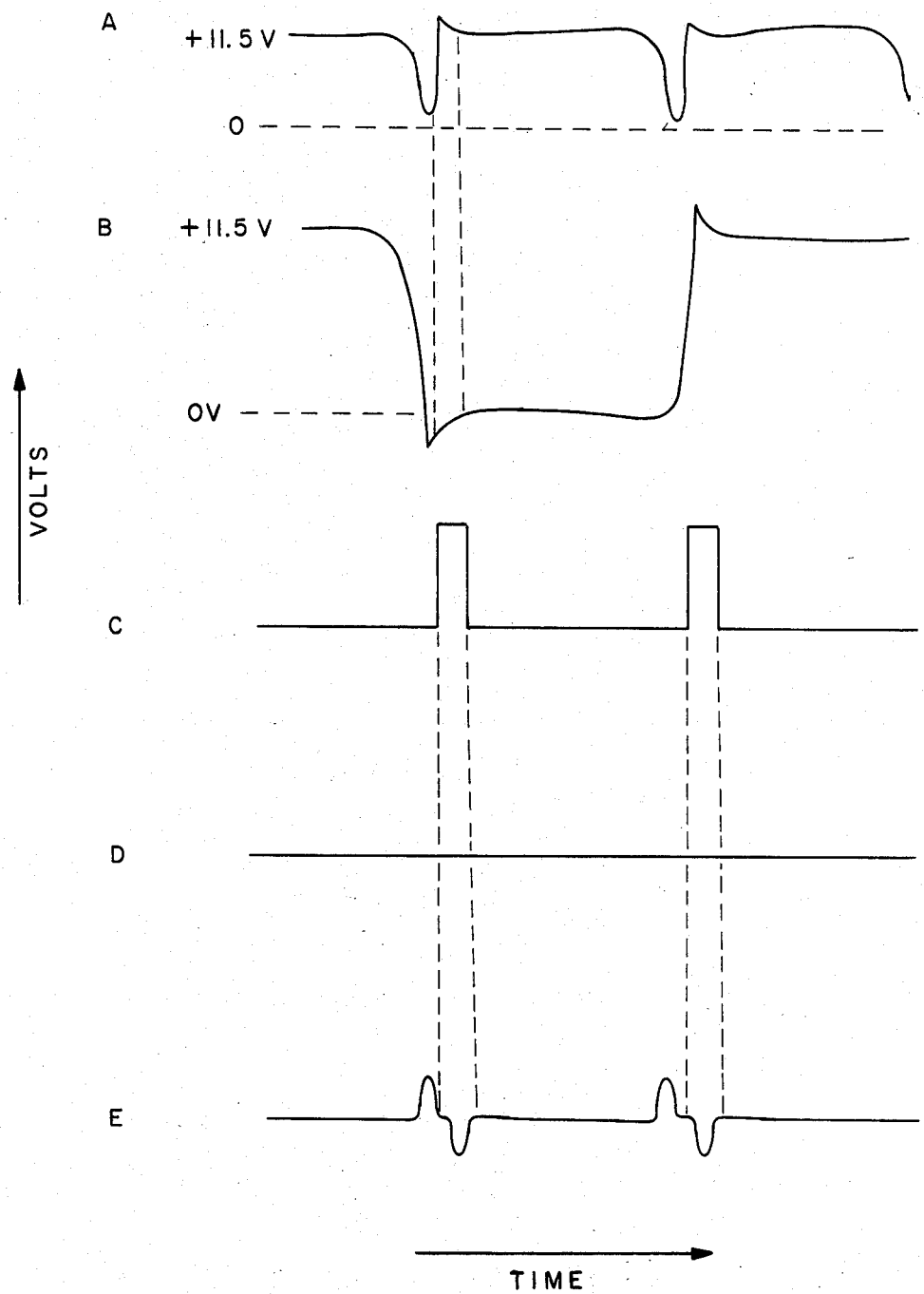
FIG. 3 shows diagrams A–E of signals found at selected nodes in the operation of the compass of FIG. 2.

Referring to FIG. 3, the waveforms A–E are waveforms of voltage as a function of time. The waveform A is the waveform which appears at a node A located between the resistor R2 and the transistors Q2 and Q4. The waveform B appears at a node B on the line 6 coupling the transistors Q3 and Q4 to the drive winding 3. The waveform C appears at a node C on the pins 5, 6 and 10 of the integrated circuit U1. The waveform D appears at a node D on the line 16 connecting the X sense winding 15 to the pin 8 of the integrated circuit U1. The waveform E appears at a node E on the line 18 coupling the Y sense winding 17 to the pin 4 of the integrated circuit U1.

In the operation of the apparatus 1, as the core 2, which may be a conventional ferrite toroid, is saturated by the drive winding 3, current flowing through the resistors R1, R2, the transistors Q1 and Q4 and the winding 3 increases rapidly. As the current in the drive winding 3 and the above-described components increases rapidly, the potential at nodes A and B drops accordingly, as shown in FIG. 3, waveforms A and B. At node A the potential drops from the supply potential of +11.5 volts to approximately 0 volts. The potential at node B drops from the supply potential of +11.5 volts to slightly below 0 volts. As this occurs, transistors Q1 and Q4 stop conducting and transistors Q2 and Q3 start conducting, driving the core 2 out of saturation. As the core 2 is driven out of saturation, the potential at node A increases from near zero to slightly above the supply voltage of +11.5 volts. As this occurs, a pulse is generated at the pin 13 of the integrated circuit U1. The pulse at pin 13 of the integrated circuit U1 closes the pole connected to the pin 1 coupling pin 1 and pin 2. The resulting 11.5 volts on pin 2 causes the control electrode coupled to pin 12 to close the pole coupled to pin 11. As the pole coupled to pin 11 is closed, a positive pulse having a period of approximately 2 microseconds is applied to pin 10 and the control electrodes coupled to pins 5 and 6 in the gate circuit 9, as shown in FIG. 3, waveform C. The application of the 2 microsecond pulse to the control electrodes coupled to pins 5 and 6 closes the poles coupled to pins 4 and 8. As the poles 4 and 8 are closed, the X and Y sense windings 15 and 17 are coupled to the X and Y filters 20 and 23, respectively.

For purposes of a further explanation of the apparatus of FIGS. 1 and 2A and 2B, it will be assumed that there is no mutual coupling between the drive winding 3 and the sense windings 15 and 17; that due to the orientation of the sense winding 15 relative to an external magnetic field there is no voltage induced in the sense winding 15 due to the external field when the core is driven into and out of saturation; and that only the sense winding 17 will produce a potential in response to the external magnetic field. Under these circumstances the potential at node D will remain at 0 volts while the potential at node E will be characterized by a positive and negative pulse as the core is driven into and out of saturation as shown by the waveforms D and E of FIG. 3. Similarly, as the core 2 is driven into and out of saturation in the opposite direction as shown by the second pulse of the waveform at node A and the positive-going trailing edge of the waveform at node B, the voltage at node D remains at 0 volts and the potential at node E reflects a positive and negative-going pulse. On the other hand, if there is coupling between the drive and sense windings, then the potential at node D would be characterized by pairs of positive- and negative-going pulses which are 180 degrees out of phase and the potential at node E would be altered accordingly.

As described above, the control pulses at node C couple the X and Y sense windings 15 and 17 to the filters 20 and 23 for a period of 2 microseconds during the time that the sense winding 17 is providing a negative-going pulse at the node E. This signal is then fed to the filter 23 which filters the signal and produces on its output a D.C. level having a magnitude corresponding to the magnitude of the output of the sense winding.

In practice, the output of the filters 20 and 23 provide a signal as follows:

$$X = C + B \cos D \sin H$$

$$Y = C + B \cos D \cos H$$

where
  C = a constant (1–4 volts)
  H = heading (angle between sine winding and longitudinal projection of earth's field)
  D = dip angle (angle between horizon and earth's field)
  B = a constant linearly proportional to the strength of earth's field From the foregoing it can be seen that by solving for H (heading) in the above equations, heading can be determined and hence the apparatus 1 can be used as a compass.

While a preferred embodiment of the present invention is described, it is contemplated that various changes may be made thereto without departing from the spirit and scope of the present invention. For this reason, it is intended that the embodiment described be considered only as illustrative of the invention and that the invention not be limited thereto but be determined by reference to the claims hereinafter provided.

What is claimed is:
1. A flux gate sensor comprising:
  a saturable magnetic core;
  a drive winding wrapped about said core;
  a sense winding wrapped about said core;
  switching means coupled to said drive winding and a source of a predetermined potential for driving said core into saturation, said switching means including means responsive to a predetermined change in the magnitude of current in said drive winding when said core becomes saturated for driving said core out of saturation;

a node located in said switching means having a potential which is driven toward said predetermined potential when said core is driven out of saturation;

means coupled to said node which is responsive to said change in potential at said node when said core is driven out of saturation for providing a gate control signal having a predetermined period; and gating means coupled to said sense winding which is responsive to said gate control signal for providing an output from said sense winding during said predetermined period.

2. A sensor according to claim 1 wherein said switching means comprises a plurality of switching transistors and said node is located between said source of a predetermined potential and said switching transistors.

3. A sensor according to claim 2 wherein said switching means comprises a predetermined resistance coupled in series with said source of a predetermined potential and said switching transistors and said node is located between said predetermined resistance and said switching transistors.

4. A sensor according to claim 1 wherein said control signal providing means comprises means for providing a pulse having said predetermined period.

5. A sensor according to claim 4 wherein said predetermined period is approximately two microseconds.

6. A sensor according to claim 1 wherein said control signal providing means comprises means for providing said control signal in response to a change in the magnitude of the current in said drive winding when said core is driven out of saturation.

7. A sensor according to claim 6 wherein said control signal providing means comprises means for providing a pulse in response to a change in the magnitude of the current in said drive winding when said core is driven out of saturation.

8. A sensor according to claim 1 comprising filtering means and wherein said gating means comprises means for gating said output to said filtering means during said predetermined period.

9. A sensor according to claim 8 wherein said predetermined period is approximately two microseconds.

10. A sensor according to claim 8 for measuring the earth's magnetic field and wherein said filtering means comprises means responsive to said output of said gating means for providing a D.C. signal corresponding to said earth's magnetic field when said sensor is placed therein.

* * * * *